United States Patent [19]
Bang

[11] Patent Number: 5,398,002

[45] Date of Patent: Mar. 14, 1995

[54] AUTOMATIC FREQUENCY CONTROL SYSTEM BY QUADRATURE-PHASE IN FREQUENCY OR PHASE DEMODULATING SYSTEM

[75] Inventor: Sa-Hyun Bang, Seoul, Rep. of Korea

[73] Assignee: SamSung Electronics Co., Ltd., Suwon, Rep. of Korea

[21] Appl. No.: 690,327

[22] Filed: Apr. 26, 1991

Related U.S. Application Data

[63] Continuation of Ser. No. 331,364, Mar. 31, 1989, abandoned, which is a continuation-in-part of Ser. No. 310,529, Feb. 15, 1989.

[51] Int. Cl.⁶ .................................................. H03D 3/00
[52] U.S. Cl. .................................... 329/302; 329/308; 329/325; 329/346; 375/327; 375/376
[58] Field of Search ............... 329/122, 124, 50, 325, 329/302, 308, 309, 346; 375/81, 120; 455/208, 209, 260, 265; 331/17, 11, 12

[56] References Cited

U.S. PATENT DOCUMENTS

| | | | |
|---|---|---|---|
| 4,083,009 | 4/1978 | Bickford et al. | 375/83 |
| 4,464,770 | 8/1984 | Maurer et al. | 375/81 X |
| 4,549,142 | 10/1985 | Yoshida | 329/124 X |
| 4,577,157 | 3/1986 | Reed | 329/317 |
| 4,674,105 | 6/1987 | Suzuki | 375/80 |
| 4,682,117 | 7/1987 | Gibson | 329/302 |
| 4,736,392 | 4/1988 | Kammeyer et al. | 375/80 |
| 4,755,761 | 7/1988 | Ray, Jr. | 329/323 |
| 4,811,363 | 3/1989 | Hoffmann | 329/124 X |
| 4,879,728 | 11/1989 | Tarallo | 375/80 |
| 4,888,793 | 12/1989 | Chanroo et al. | 375/84 |
| 4,912,422 | 3/1990 | Kobayashi et al. | 329/306 |

*Primary Examiner*—Siegfried H. Grimm
*Attorney, Agent, or Firm*—Robert E. Bushnell

[57] ABSTRACT

A method and apparatus for digitally demodulating a phase or frequency modulated signal using a quadrature mixing circuit to mix the phase or frequency modulated signal with a frequency equal to the carrier frequency of the received modulated signal to produce in-phase component signal (I) and a quadrature component signal (Q) of the received phase or frequency modulated signal which differ in phase by 90 degrees. The I and Q signals are provided via respective low pass filters to a phase to digital converter for generating a digital output signal. The digital output signal is provided to an interface circuit which generates a plurality of phase-change information signals which are provided to a signal processing circuit. The signal processing circuit uses interpolation circuitry to produce a demodulated signal. A further output of the signal processing circuit, i.e. a D.C. signal, is fed back to provide automatic frequency control to an oscillator in the quadrature mixing circuit.

33 Claims, 8 Drawing Sheets

AUTOMATIC FREQUENCY CONTROL SYSTEM BY QUADRATURE-PHASE IN FREQUENCY OR PHASE DEMODULATING SYSTEM

This is a continuation of U.S. application Ser. No. 07/331,364, filed Mar. 31, 1989, which is a continuation-in-part of U.S. application Ser. No. 07/310,529, filed Feb. 15, 1989.

BACKGROUND OF THE INVENTION

The present invention relates to a demodulation system for frequency- or phase-modulation signals, and more specifically relates to an automatic frequency control system for use in digital demodulation of the frequency- or phase-modulation signal by using quadrature-phase.

Generally, a frequency modulation (FM) receiver employs primarily a superheterodyne system, in which a double frequency conversion is executed that is different from a conventional superheterodyne system, as shown in FIG. 1. Referring to FIG. 1, a conventional automatic frequency control system will be explained with reference to the superheterodyne system of a double frequency conversion which includes first and second local oscillators (3,6), first and second mixers (4,7), and the first and second IF (Intermediate Frequency) filters (5,8). When a radio frequency (hereinafter referred to as RF) signal modulated in frequency or phase is received through an antenna 1, it is applied to the first mixer 4 through a low-noise amplifier 2. At this moment, the first mixer 4 produces a first IF signal by mixing the received RF signal and a first local oscillation signal (LS1) generated from the first local oscillator 3, and the first IF filter 5 eliminates undesirable components such as image-frequency and higher-harmonics thereof resulting from the mixing in the first mixer and thereby detects only the IF signal (IF1). The second mixer 7 produces a second IF signal by mixing said first IF signal (IF1) and a second local oscillation signal (LS2) generated from the second local oscillator 6, and the second IF filter 8 outputs the second IF signal (IF2) and thereby eliminates any adjacent frequencies in order to take extremely sharp discrimination against adjacent channels. Here, ordinarily the first IF signal is a high frequency of several tens of MHz band and the second IF signal is a relatively low frequency band. A FM demodulator 9 reproduces the original signal by demodulating the second IF signal (IF2). When a frequency deviation is present in the first local oscillator 3 and second local oscillator 6, the output of the FM demodulator 9 produces a direct-current (DC) output proportional to said frequency deviation. In order to compensate this, the output of the demodulator 9 is applied to a low-pass filter (LPF) 10 whose cut-off frequency is considerably low, and the LPF 10 eliminates the alternating-current (AC) components from the demodulation signals, thereafter filtering only the direct-current signals to a voltage controlled oscillator 11.

Therefore, since the first local oscillator 3 is synchronized with the output of the voltage controlled oscillator 11, if the voltage controlled oscillator 11 is controlled toward the direction of offsetting the direct-current component according to the deviation of frequency, the first local oscillation signal (LS1) tracks the RF signal received. However, since the direct-current signal passed through the demodulator 9 is proportional to a sum of deviations of the local oscillation frequencies LS1 and LS2 of the first and second local oscillators 3 and 6, it operates mostly with an error against the frequency deviation of the second local oscillator 6. Further, since the LPF is an analog circuit having a low cut-off frequency, it is impossible to ideally eliminate the alternating-current component of the demodulation signal. Also, when the signal of such an alternating-current component is fed back to the first local oscillator 3, the first local oscillation frequency becomes unstable and is apt to include noise and the like. Moreover, there has been a problem that a part of such signals is modulated into the output in case of a full-duplex system.

SUMMARY OF THE INVENTION

Therefore, an object of the present invention is, in a system that digitally demodulates frequency- or phase-modulated signals by utilizing a quadrature-phase, to provide an automatic frequency control system for stables controlling the local oscillation frequency by digitally filtering the direct-current component occurring from the frequency deviation.

According to one aspect of the invention, the automatic frequency control system includes the control steps of: (a) detecting a digital value according to a direct-current component produced by deviation of a local oscillation frequency among demodulation signals (b) converting the direct-current component to an analog signal; and (c) performing a voltage controlled oscillation for controlling the local oscillation frequency in response to the analog signal.

BRIEF DESCRIPTION OF THE DRAWINGS

The features and advantages of the system according to the invention will now be explained hereinafter with reference to the accompanying drawings, wherein.

DETAILED DESCRIPTION OF THE INVENTION

Figure 1:
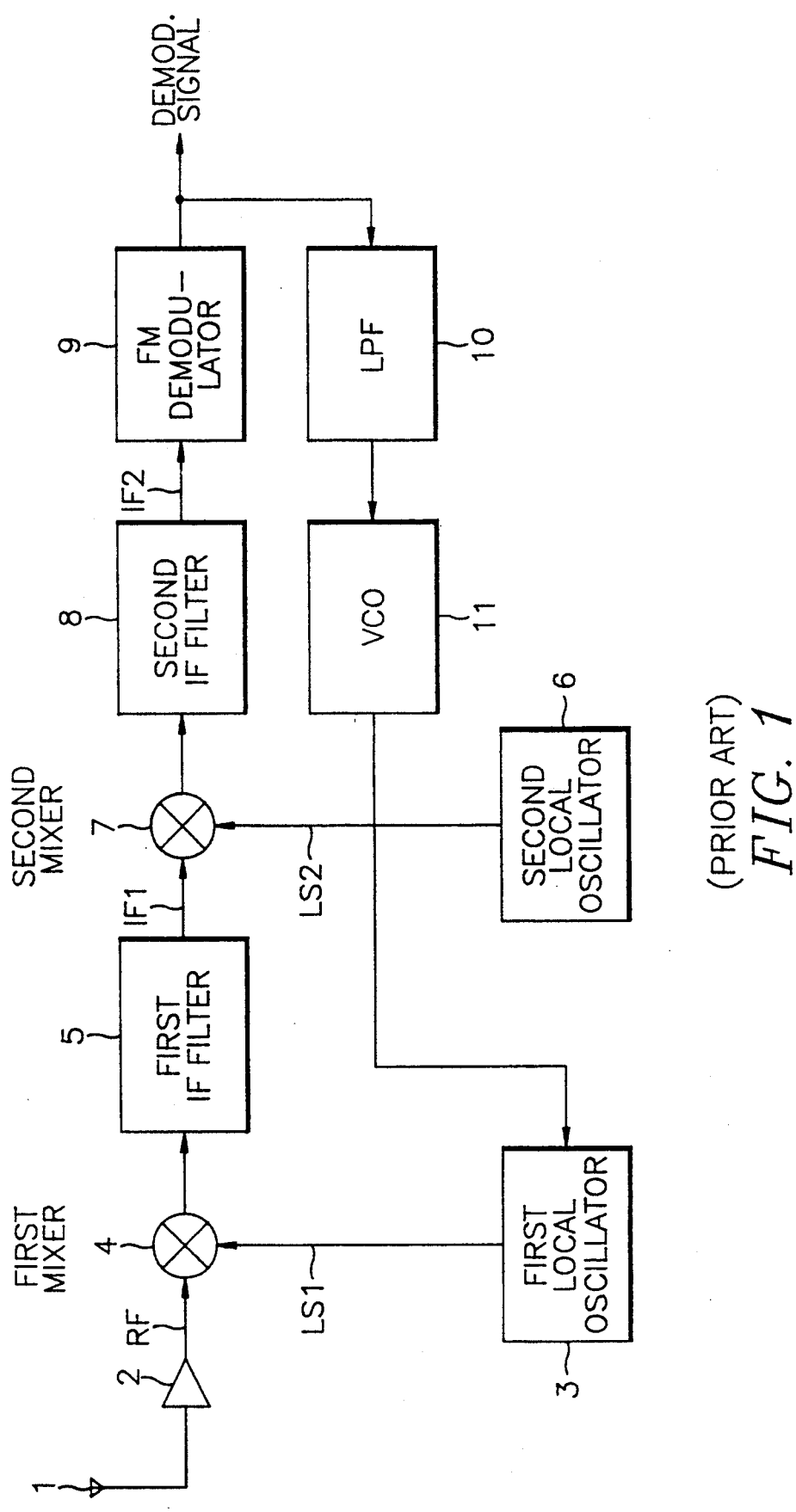
FIG. 1 shows a block diagram of conventional frequency and phase demodulating system of the superheterodyne system.
Figure 2:
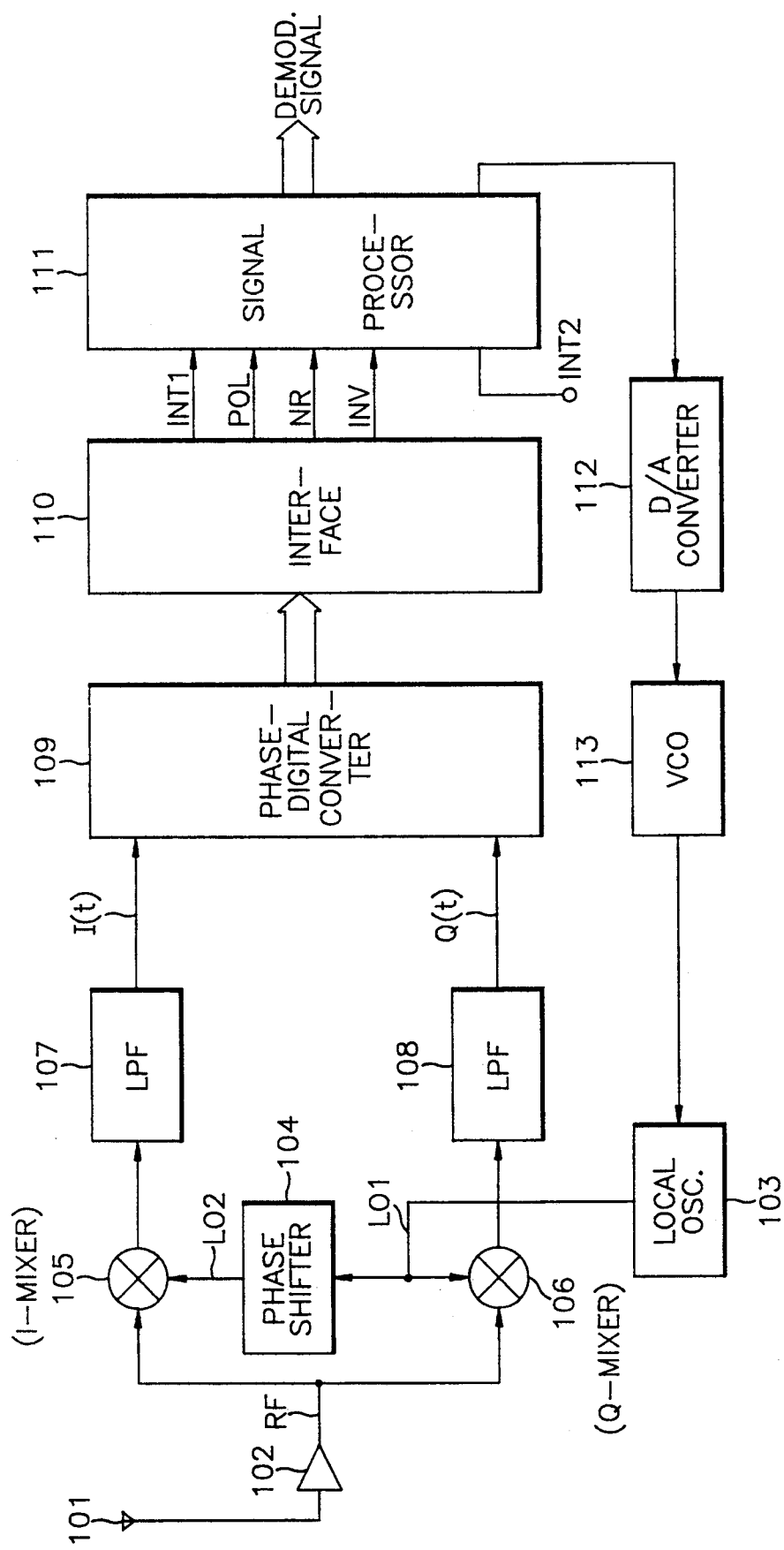
FIG. 2 shows a block diagram of a preferred embodiment system according to the present invention.

According to the present invention FIG. 2 shows a block diagram of a preferred embodiment of the demodulating system. An antenna 101 receives a frequency- or phase-modulated RF signal. A low-noise amplifier 102 amplifies the RF signal received through the antenna 101 with low noise. A local oscillator 103 oscillates a first local oscillation frequency LO1 that is equal to a carrier wave of the modulation signal. A phase shifter 104 generates a second local oscillation frequency LO2 by shifting by 90 degrees a phase of first local oscillation frequency of the local oscillator 103. An I-channel mixer 105 mixes the received RF signal and the second oscillation signal LO2 of the phase shifter 104. A Q-channel mixer 106 mixes the received RF signal and the first local oscillation signal LO1 of the local oscillator 103. A first LPF 107 filters the output of the I-channel mixer 105 with a ½ RF band. A second LPF 108 filters the output of the Q-channel mixer 106 with a ½ RF band. Phase-digital converter 109 converts a predetermined phase relation into a digital signal by applying a formula of MODULO $[\pi/2^n]$ (here, n=1,2,3,4, ... ) to the phase of I-channel and Q-channel signals through the first and second LPF 107–108. Interface 110 generates a plurality of phase-change information including a first interrupt signal INT1 that detects the phase change of the MODULO $[\pi/2^n]$, a first control signal POL that discriminates the polarity of rotation, a second control signal NR that represents whether the rotation step is normally increased or decreased, and a third control signal INV that represents a moment that the polarity-advance direction of the phase rotation varies, in case of phase rotation of $(\pi/2^n)$ in phase-digital conversion data of the phase-digital conversion means 109. A signal processor 111 counts a period of the first interrupt signal INT1 and therein stores the count as well as the phase-change information of the interface 110, in which a demodulation signal is produce by interpolating a present sampling-moment value to a basic demodulation signal accumulated through a last sampling period according to a second interrupt signal INT2 generated at each predetermined sampling period. At the same time, the phase-change information of the present sampling period is accumulated for a next interpolation sequence and then a mean value of the demodulation signal is compensated, a present direct-current value being thereby provided. A digital-to-analog (D/A) converter 112 receives a DC signal, made from deviation of two successive RF frequencies of the output demodulation signal of the signal processor, to convert it into a DC analog signal. A voltage controlled oscillator (VCO) 113 controls the oscillation frequency of the local oscillator 103 in response to receiving the direct current signal generated according to the frequency deviation of the digital-analog converter 112.

Figure 3:
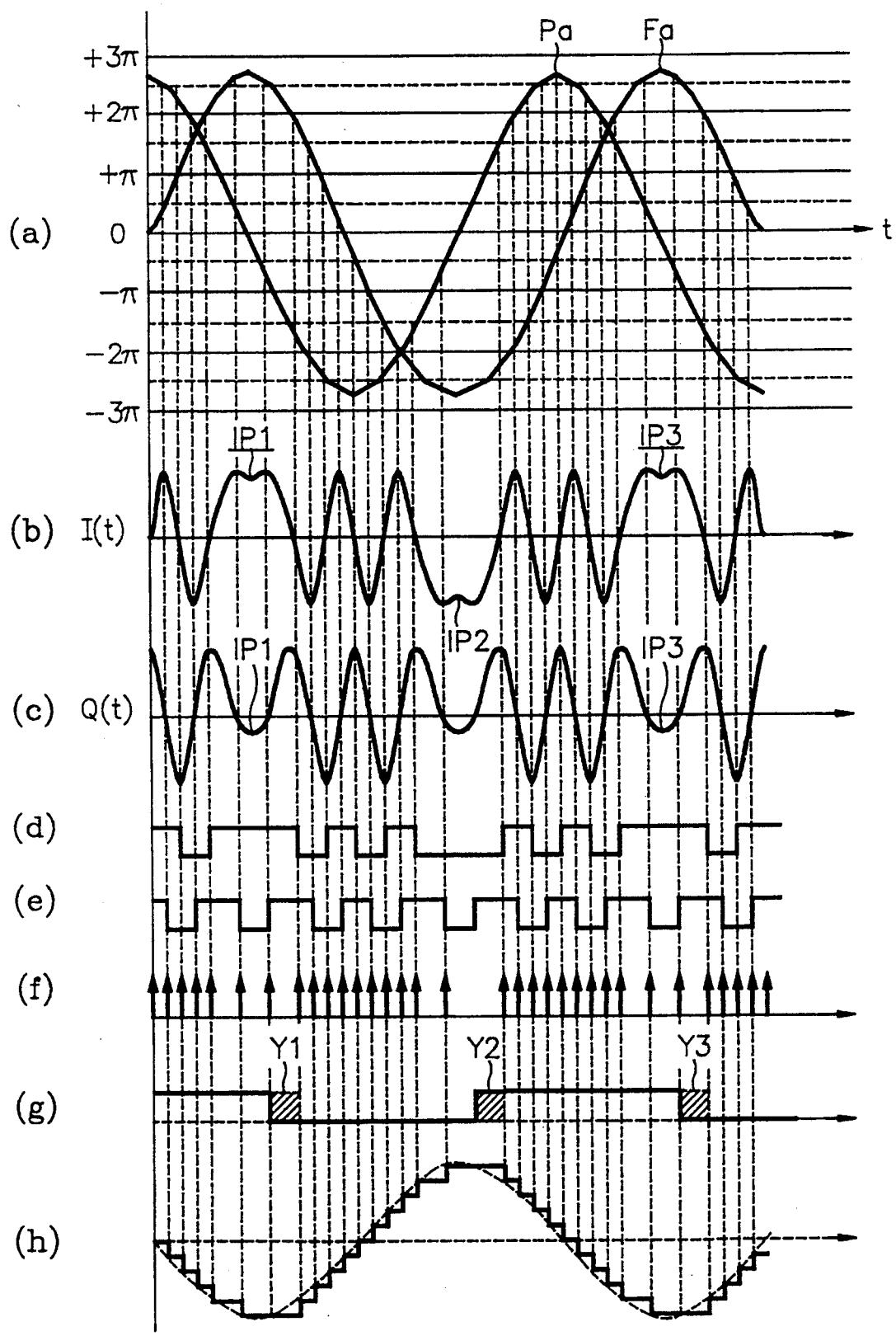
FIG. 3 shows waveforms of every aspect of operation in FIG. 2.

FIG. 3 illustrates every aspect of operations in FIG. 2, by using various waveforms, which are used for explaining the demodulating process of the frequency-modulated and phase-modulated RF signals when the received RF frequency is 1 KHz and the modulo $(\pi/2^n)$ is n=1, wherein Fa in FIG. 3(a) is a waveform for the frequency modulation, and Pa in FIG. 3(a) is a waveform for the phase modulation.

The present invention will be further explained with reference to FIGS. 2 and 3 based on the configuration. Here, it will be assumed that a received RF signal is 1 KHz and its modulation index (Kp) is Kp=1, so that it is an ideal phase-modulated signal such as the curve Pa. The received RF signal is applied through an antenna 101 and a low-noise amplifier 102 to an I-channel mixer 105 and to a Q-channel mixer 106. The local oscillator 103 generates a first local oscillation signal LO1 having a frequency identical to the carrier wave of RF signals. The first oscillation frequency LO1 is made to shift so as to have the phase difference of 90° ($\pi/2$) through a phase shifter that generates the second local oscillation frequency LO2. The phase shifter applies the second local oscillation signal LO2 to the I-channel mixer 105, while the first local oscillation signal LO1 is supplied to the Q-channel mixer 106. I-channel mixer 105 produces an intermediate frequency in the I-channel by mixing the received RF signals and the first local oscillation signal LO2 and then outputs to first LPF 107. The first LPF 107 filters this signal to an ½ band-width, and, upon frequency conversion, it eliminates high-harmonic frequency and image signals produced in IF of the I-channel and their adjacent frequencies, thereby producing the I(t) signal of FIG. 3(b) according to the below-described formula (1). The Q-channel mixer 106 mixes the first local oscillation signal LQ1 and the received RF signals, and the second LPF 108 operates in a way similar to the first LPF 107, thereby producing the Q(t) signal of FIG. 3(c) according to the below-described formula (2).

$$I(t) = A \cos [W_0 \cdot t + m(t)] \quad (1)$$

$$Q(t) = A \sin [W_0 \cdot t + m(t)] \quad (2)$$

wherein,
A: Amplitude of waveform
Wo: Each frequency deviation of input signal and local oscillation signal (offset frequency between the input and local RF signals)
m(t): Phase modulation signal The phase-digital converter 109 which inputs the I(t) and Q(t) signals of FIG. 3(b) and (c) in accordance with above-described formulae (1) and (2), converts into digital signals by comparing and detecting each phase of two signals according to the below-described formula (3).

$$\text{MODULO}[\pi/2^n](n=1,2,3,4, \ldots) \quad (3)$$

When the phase is $\pi/2$ (n=1), the zero-crossings of the signals I(t) and Q(t) are each detected, and I(t) and Q(t) according to each phase are coverted into digital signals as in FIG. 3(d) and (e). In the above-described formula (3), if the phase-digital conversion is to be done at $\pi/4$, then n=2, and also if it is $\pi/8$, then n=3, whichever can be easily executed according to the requirement.

The interface 110 receives the phase-digital data of phase-digital converter 109, produces the first interrupt signal INT1 and the other control signals (POL, NR, INV) that are the phase shift information for demodulating the received RF signals at the signal processor 111. Firstly, the first interrupt signal INT1 is a train of pulse signals produced as in FIG. 3(f) upon detection of any phase change according to the formula (3) in the phase rotation of MODULO$[\pi/2^n]$(n=1,2,3,4, ... ), and becomes a periodic signal of quantizing step upon demodulation. Secondly, the first control signal POL, which is a signal for representing the shift in rotation of the formulae (1) and (2), is used to discriminate whether the polarity of correlative phase of the I-channel signal and the Q-channel signal is positive (+) or negative (−). Also, it is a signal for executing an increase or decrease of the quantization step upon demodulation. Thirdly, the second control signal NR is a signal to represent whether it shifts normally by one step toward the negative or positive direction during phase rotation. In case of the first interrupt signal INT1 being produced, when a position to be demodulated is set at the same step as a previous state, or when it travels over two steps, it is treated as an abnormal signal. Fourthly, the third control signal INV represented by waveform (g) of FIG. 3, is to represent the moment that the polarity of phase rotation is shifted. Whenever the Q-channel signal of FIG. 3(c) has each phase-inversion shown by timing points (IP1 to IP3), there are made state changes as shown by numerals Y1 to Y3 in FIG. 3(g).

The signal processor 111 stores into a first buffer the phase shift information produced at the interface means upon each phase shift of the I-channel and Q-channel during a period of the second interrupt signal INT2, that is, a sampling signal having a predetermined period. Thereafter, a basic demodulation signal, which was accumulated into a second buffer without demodulation by inputting into the previous-state sampling period, is demodulated by interpolation with the current sampling moment value. Here, the interpolation means that when pulses of the second interrupt signal are produced between pulses of the first interrupt signal INT1, the quantizing step of the previous state sampling period is added or subtracted, and then the demodulation is executed in accordance with the quantizing step of the previous sampling period by taking a momentary value of the second interrupt generation. After the demodulation according to the sampling period of previous state is executed, the phase shift information of the sampling period is accumulated and an average direct-current component of the output demodulation signal is compensated, in order to execute the interpolation upon a next sampling signaling.

In the signal processing means 111, when the modulation signal is demodulated, a DC component proportional to the deviation of two RF frequencies is detected, in which an AC component thereof is eliminated by utilizing a digital low-pass filter DLPF 2 because a part of the demodulation signal may be included therein while detecting the DC component. Generally in a digital signal processor, since the number of processing bits is considerably large (usually over 16 bits, and (all of the bits of the direct current detection data are not required), when executing an automatic frequency control (AFC) operation, according to the present invention and during the digital signal processing of the signal processor 111, the digital signal processor outputs a direct current signal to the digital-analog converter 112 after determining the number of bits used for AFC. At this time, the number of the bits used is determined in accordance with the maximum frequency deviation of the local oscillator 103 depending upon the environmental condition, and by this signal, the digital-analog converter 112 delivers the direct-current signal, converted from the digital signal to the analog signal, to the voltage controlled oscillator 113. The voltage controlled oscillator 113 eliminates the direct-current component occurring from the frequency deviation by controlling the local oscillator 103.

Figure 4:
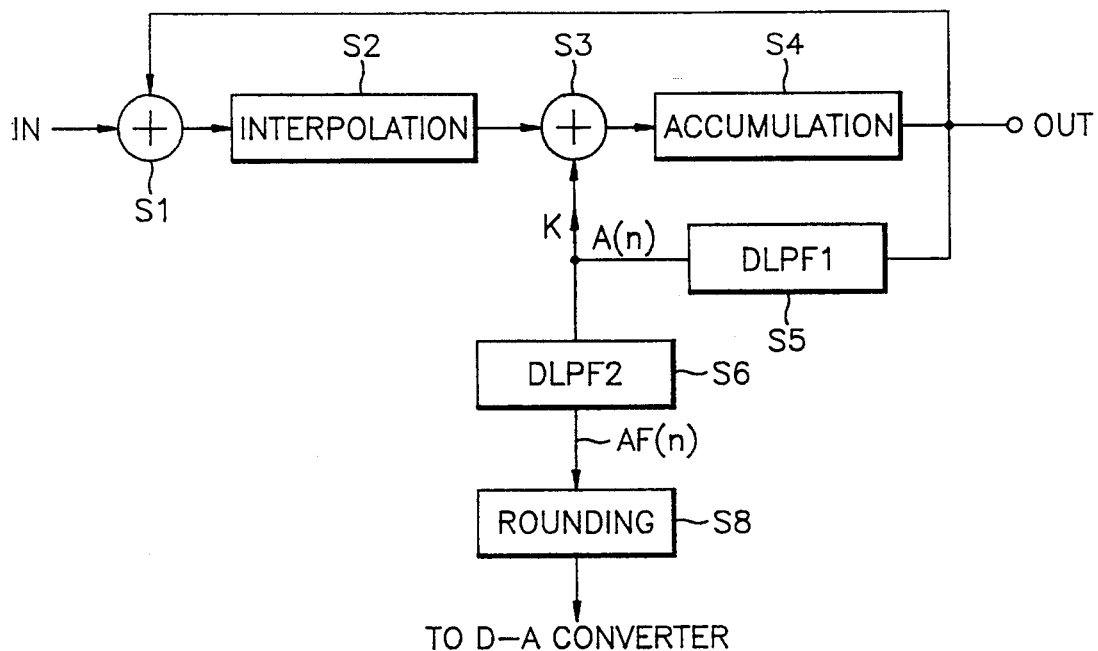
FIG. 4 is a software block diagram for explaining the demodulation operation of the frequency- or phase-modulation signal in signal processing means of FIG. 2.

FIG. 4 is a software block diagram for explaining the demodulation operation of the frequency- or phase-modulation signal in signal processor 111 of FIG. 2 wherein an operational sequence is shown that the input phase shift information produced at the interface 110 is accumulated, the modulation signal is demodulated according to the input information accumulated during the sampling period, a direct-current level of the demodulation signal, is compensated by detecting the direct-current signal of the demodulation signal, and the number of use-bits designated is provided after preferably further eliminating AC components out of the DC signal.

Figure 5:
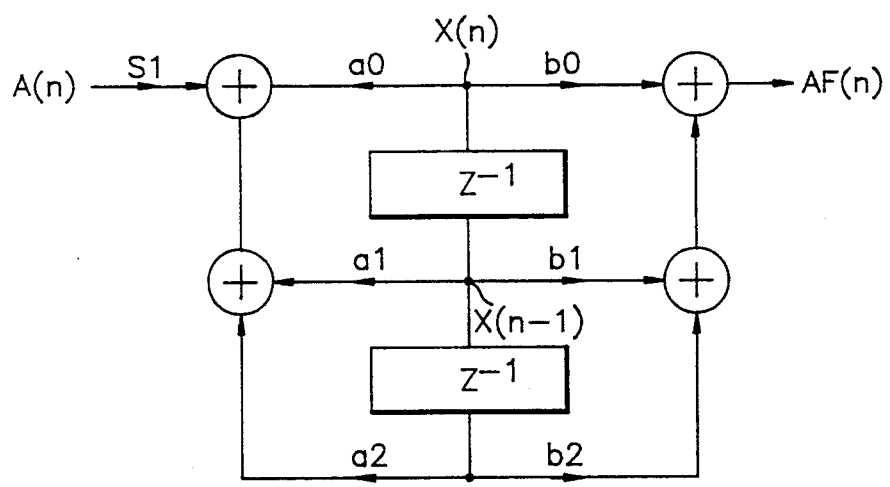
FIG. 5 shows a network diagram of a digital filter in FIG. 4.
Figure 6:
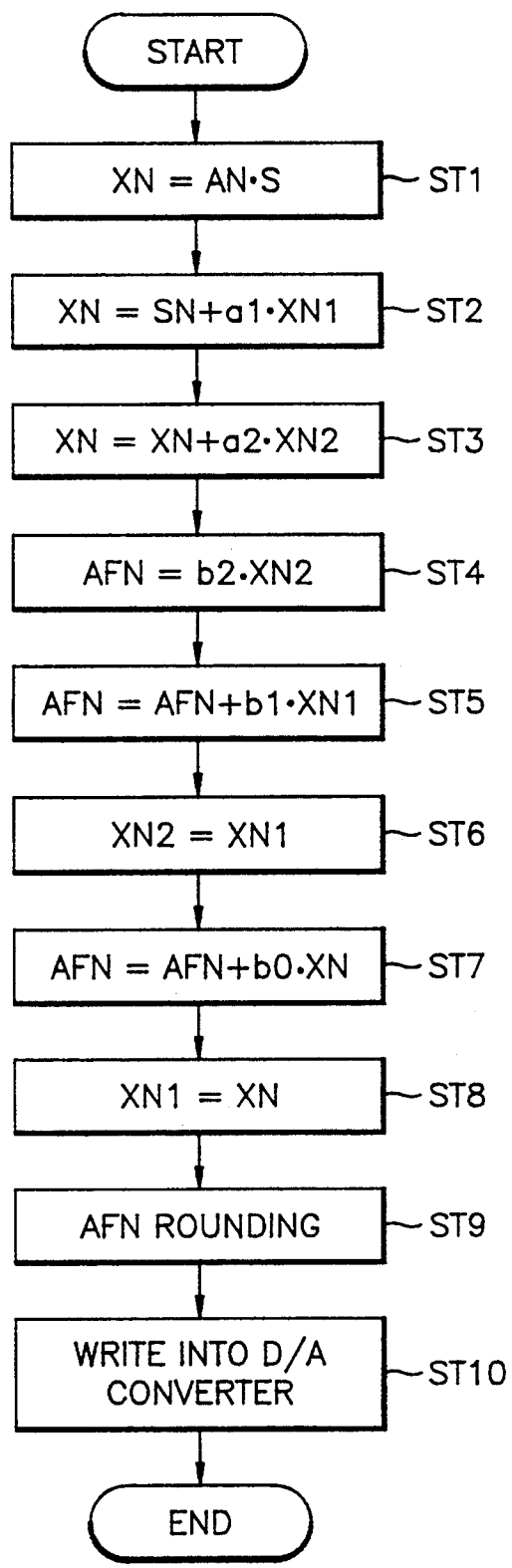
FIG. 6 is a flow chart illustrating the generation of an automatic frequency control (AFC) signal according to the present invention.
Figure 7:
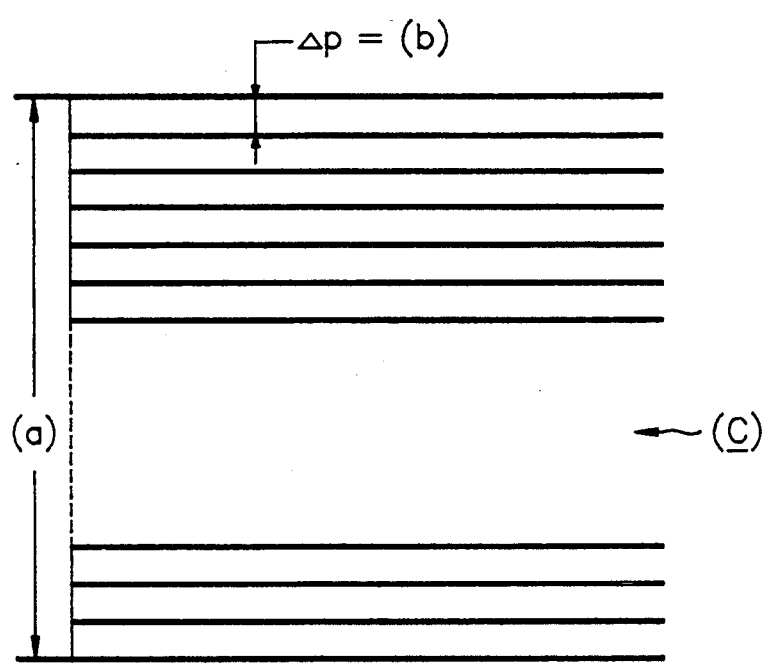
FIG. 7 is a schematic diagram explaining a method to determine the number of bits used in a control signal for the AFC in accordance with the present invention.
Figure 8A:
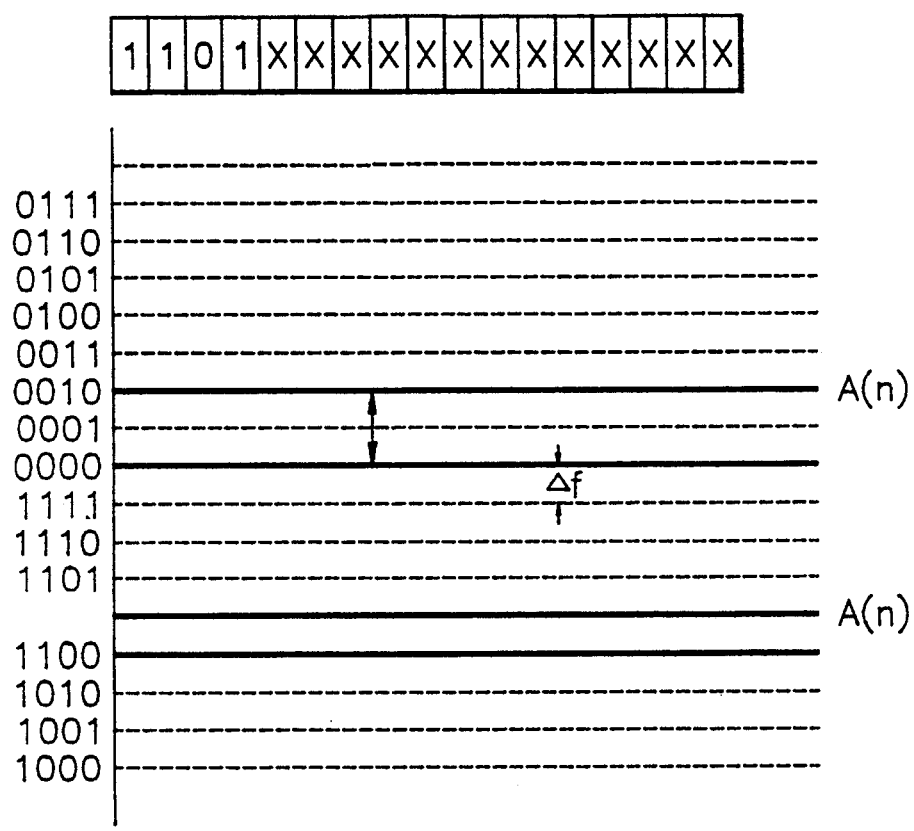
FIGS. 8A to 8C each are schematic diagrams or graphs indicative of the AFC operation in accordance with the present invention.
Figure 8B:
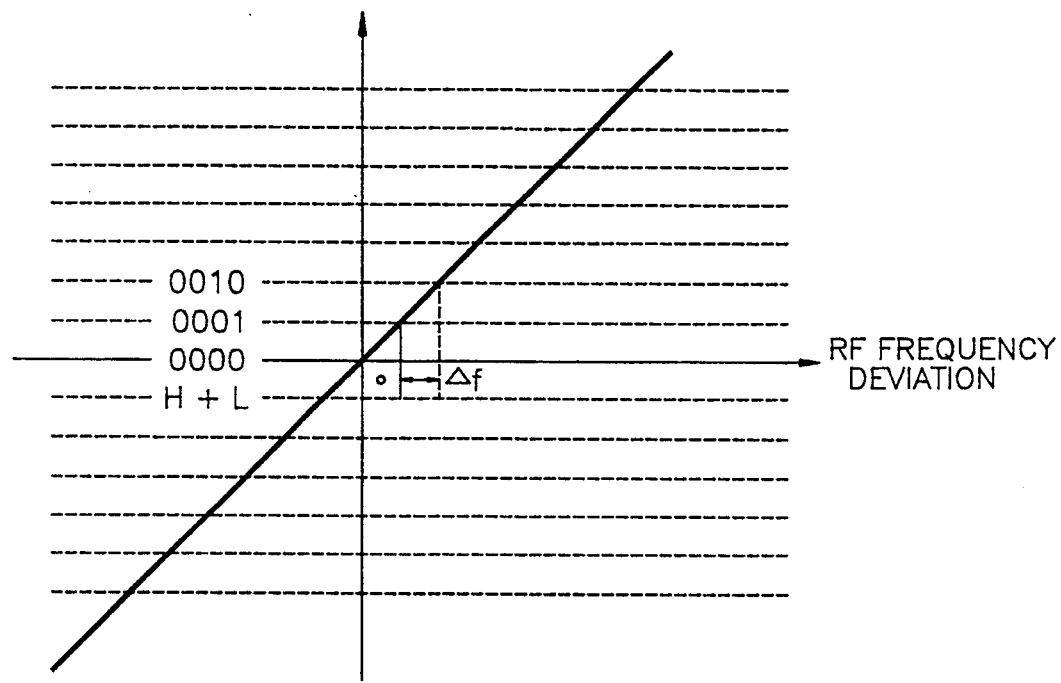
Figure 8C:
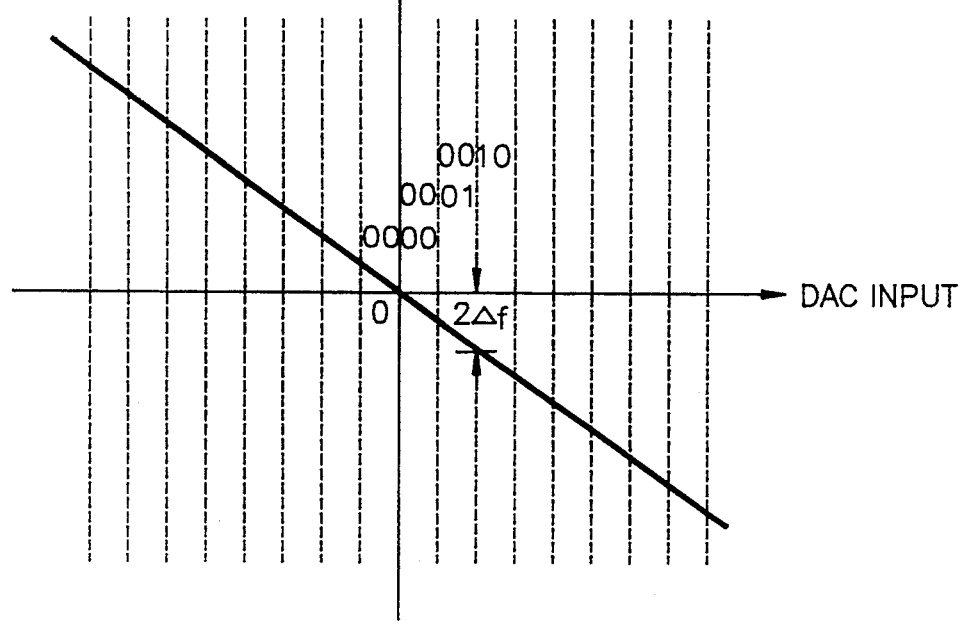

FIG. 5 is a digital filter DLPF2 of infinite impulse response (IIR) type for eliminating the AC modulation signals included partly in the detected DC signal. FIG. 6 is a flow chart illustrating the generation of an automatic frequency control (AFC) signal according to the present invention. In accordance with the present invention FIG. 7 is a schematic diagram explaining a method to determine a number of bits used in a control signal for the AFC. Additionally, FIG. 8A is a diagram showing the AFC operation in accordance with voltage controlled oscillation; FIG. 8B is a graph diagram showing the relation of the digital value to the RF frequency band, and FIG. 8C is also a graph diagram showing the variation of the input versus the oscillation frequency in digital-analog converter 112.

The present invention will be now explained in detail in accordance with the aforementioned drawings. The signal processor 111 is a digital signal processor, which processes the phase shift information produced at interface 110, as in FIG. 4. When the first interrupt signal is produced, the signal processor 111 stores the corresponding phase shift information (a quantizing period and the first to third control signals) into the first buffer, reads the information stored upon input of the second interrupt signal INT2, accumulates sequentially the value of the present state to that of the previous state through an accumulation step S4 from an adding step S1, and demodulates the modulation signal of the corresponding sampling period. At this moment, since the direct-current level; (according to the frequency deviation of the demodulation signal) increases toward a positive direction, the direct-current component A (n) is detected through the DLPF1 (step: S5) of the first digital low-pass filter, thereby compensating to a negative direction at the adding step S3. Here, an interpolator step S2 is for demodulating the signal corresponding to the sampling period by the second interrupt signal INT2.

Then, in order to execute the AFC operation, it applies the output of DLPF1 (S5) to DLPF 2 (S6) which is the second digital low-pass filter. DLPF2 decreases the alternating-current component of the demodulating signals in which a part of the detected direct-current signals is included. The DLPF2(S6) represents a software construction of a digital filter of IIR type as in FIG. 5, of which output may be obtained by a formula (4) as below.

$$H(Z) = \frac{\sum_{k=0}^{M} b_k \cdot Z^{-k}}{1 - \sum_{k=1}^{N} a_k \cdot Z^{-k}} \quad (4)$$

Accordingly, as in FIG. 5, if in case of a=2 and b=2, it becomes as the formulae (5) and (6) as below.

ti $X(n) = S \cdot A(n) + a1 \cdot X(n-1) + a2 \cdot X(n-2)$ (5)

$AF(n) = b0 \cdot X(n) + b1 \cdot X(n-1) + b2 \cdot X(n-2)$ (6)

wherein,
A(n): average value of the direct-current of the demodulation signal at the corresponding sampling period
S: scaling factor
Z: delay time of one sampling period
X(n): filter node value
a1,a2,b0,b1,b2: filter coefficients AF(n): direct-current through DLPF2

Therefore, in order to evaluate AF(n), the signal processor 111 computes the X(n) value and AF(n) value by flow as shown in FIG. 6, wherein XN denotes X(n), XN1 denotes X(n−1), XN2 denotes X(n−2), AN denotes A(n) and AFN denotes AF(n).

In FIG. 7, if it is assumed that the local oscillation frequency of the local oscillator 103 is 300 MHz, the frequency deviation is 15 KHz (in case of 55 ppm) and the required frequency stability of the system is 1 KHz, then it should be divided into at least 15 steps, for which the control signal of over 4 bits is required in the digital-analog converter 112. Therefore, the reason for executing a rounding operation at step ST9 is that since so many bits are not required in case of dividing the maximum frequency deviation by several steps according to the frequency stability that the system requires, are selected only the high-order bits are selected out of a predetermined number of bits according to the required step, and since an AC component is included at low-order bits, even though it is very small, such an AC component is preferably eliminated.

At a step ST10, after executing the rounding of the step ST9, the direct-current signal of the predetermined bits is applied to the digital-analog converter 112, then converted to an analog signal and delivered to the voltage controlled oscillator 113. Accordingly, in processing the direct current value so that the remaining AC component included in the direct current signals is eliminated through the processes of the steps ST1–ST8 in FIG. 6, since said processing bit number is considerably large (over 16 bits) during processing of digital signals in the signal processing means 111, the value obtained at the DLPF2 also has such a number of bits. Therefore, at the step ST9, only the high order bits of predetermined number are selected by executing the rounding operation. At this point, the selection of the utilizing bit numbers is determined in accordance with the maximum frequency deviation of the local oscillator 103 depending upon the surrounding environmental condition (temperature, degrade in long duration, etc.). That is to say, even in case of a crystal oscillator, 55 ppm of frequency deviation is usually provided. The utilizing bit number is evaluated by dividing maximum frequency deviation into a number of several steps as shown by (c) in FIG. 7 in accordance to the frequency stability (for example, 1 KHz) required by the system as (b) after evaluating the maximum frequency deviation (for example, 15 KHz) of a desired oscillation frequency as (a). Since the oscillation frequency of the local oscillator 103 is synchronized with the voltage controlled oscillator 113, the voltage controlled oscillator 113 is controlled toward the direction of offsetting the DC component by the deviation of the oscillating frequency.

It will be explained by assuming that the DC signal by the frequency deviation entering to the digital-analog converter 112 is 4 bits. In case that one step is Δf in FIG. 8A, if it is assumed that a deviation is produced by as much as +2Δf as in FIG. 8B in the direct-current component of the demodulation signal, the high-order 4 bits of the direct current signal [A(n)] is 0010. Hence, if a '01' signal is applied to the digital-analog converter 112, it is converted to the analog signal and delivered to the voltage controlled oscillator 113. The voltage controlled oscillator 113 is rendered to decrease the oscillating frequency of the local oscillator 103 by the amount of 2Δf as is shown in FIG. 8C.

As aforementioned, since the direct-current signal produced by the frequency deviation is detected in digital, the alternating-current component of the demodulation signal can be offset effectively. Also, since, after dividing the maximum frequency deviation of a local oscillator with predetermined steps in accordance with the frequency stability required in a system, the AFC operation according to the predetermined steps can be executed accurately. The noise and the occurrence of unstable signals upon mixing can be prevented. Moreover, since the digital data of the direct-current signal of a digital signal processor is divided to the predetermined bits so that the utilizing bit can be selected, a number of the shift bits of the digital-analog converter can be decreased, therefore achieving advantages in the cost and the size reduction of the system.

While the invention has been particularly shown and described with reference to a preferred embodiment, it will be understood by those skilled in the art that modifications in detail may be made without departing from the spirit and scope of the invention.

What is claimed is:

1. A method for automatically controlling frequency in a circuit demodulating frequency modulated signals and phase modulated signals by utilizing quadrature phase, comprising the steps of:

detecting, from demodulated output signals developed by utilizing digital representations of quadrature-phase frequency or phase modulated signals obtained by mixing an input frequency or phase modulated signal with quadrature phases of a local oscillation signal, a direct current component accompanying the demodulated output signals;

attenuating alternating-current components accompanying the direct-current component and, thereafter, providing digital values indicative of said direct-current component;

converting said digital values into analog signals; and applying said analog signals to a voltage controlled oscillator for controlling the frequency of said local oscillation signal in response to said analog signals.

2. A method according to claim 1, further comprised of:

evaluating stability of said frequency of said local oscillation signal to determine a range of deviation of the frequency of the local oscillation signal and dividing said range into a number of incremental variations of frequency, and thereafter reducing said digital values to a selected number of bits sufficient to define said range, whereby the analog signals are consequently produced from said selected number of bits.

3. A process for automatically controlling frequency during quadrature phase demodulation of frequency or phase modulated signals, comprising the steps of:

receiving frequency or phase modulated radio frequency signals exhibiting a carrier frequency;

amplifying the radio frequency signals to provide amplified signals;

mixing a first local frequency signal with said amplified signals to produce first intermediate signals;

mixing a second local frequency signal with said amplified signals to produce second intermediate signals;

said first and second local frequency signals exhibiting the same frequency as said carrier frequency, with said first and second local signals differing in phase;

converting a phase relation between said first and second intermediate signals into digital signals by applying a formula MODULO ($\pi/2^n$) to a comparison of phases of said first and second intermediate signals;

generating a plurality of data signals on the basis of said digital signals, with said data signals representing information about changes of phase, on the basis of said digital signals, said data signals including a first interrupt signal representing changes in phase of said formula;

storing said data signals representing said information during each period of a sampling signal;

generating a demodulated signal by interpolating said stored data signals representing said information;

determining an electrical current value accompanying said demodulated signal and generating a parameter value indicative of said electrical current value; and controlling generation of said first and second local frequency signals in dependence upon said parameter value.

4. The process of claim 3, further comprised of additionally generating as said plurality of data signals, a first control signal representing polarity of phase rotation, a second control signal representing whether said phase rotation is increasing or decreasing, and a third control signal representing occurrence of variation in direction of polarity-advance of said phase rotation.

5. The process of claim 3, further comprised of eliminating harmonic frequency and image signals from said first and second intermediate signals while converting said phase relation into digital signals.

6. The process of claim 3, further comprised of setting said differences in phase to ($\pi/2$).

7. The process of claim 3, further comprised of detecting zero crossings of said first and second intermediate signals before converting said phase relation.

8. The process of claim 3, further comprised of:
detecting a direct current component, of said electrical current value accompanying said demodulated signal, during a sampling period.

9. The process of claim 8, further comprised of:
generating a third intermediate signal by attenuating alternating current components accompanying said direct current component; and
filtering said third intermediate signal to provide said parameter value, said parameter value being comprised of a plurality of bits.

10. The process of claim 9, further comprised of applying only a predetermined number of the most significant bits of said parameter value to control said generation of said first and second local frequency signals.

11. The process of claim 3, further comprised of:
detecting a digital value indicative of any direct current component, of said electrical current value accompanying said demodulated signal.

12. The process of claim 11, further comprised of:
generating a third intermediate signal by attenuating alternating current components accompanying said digital value indicative of said direct current component; and
filtering said third intermediate signal to provide said parameter value, said parameter value being comprised of a plurality of bits.

13. The process of claim 12, further comprised of applying only a predetermined number of the most significant bits of said parameter value to control said generation of said first and second local frequency signals.

14. A process for controlling frequency during quadrature phase demodulation of frequency modulated signals and phase modulated signals, comprising the steps of:

converting a phase relation between first and second quadrature-phase intermediate frequency signals into digital signals by applying a formula MODULO ($\pi/2^n$) to a comparison of phases of said first and second intermediate frequency signals;

generating a plurality of data signals on the basis of said digital signals, with said data signals representing information about changes of phase, said data signals including a first interrupt signal representing changes in phase of said formula;

generating a demodulated signal on the basis of said data signals representing said information, by interpolating said data signals representing said information;

determining a direct current value characteristic of said demodulated signal and generating a parameter value indicative of said direct current value, said parameter value being comprised of a plurality of bits;

controlling generation of first and second local oscillation frequency signals in dependence upon said parameter value.

15. The process of claim 14, further comprised of additionally generating as said plurality of data signals, a first control signal representing polarity of phase rotation, a second control signal representing whether phase rotation is increasing or decreasing, and a third control signal representing occurrence of variation in direction of polarity-advance of said phase rotation.

16. The process of claim 14, further comprised of eliminating harmonic frequency and image signals from said first and second intermediate signals while converting said phase relation into digital signals.

17. The process of claim 14, further comprised of detecting zero crossings of said first and second intermediate frequency signals before converting said phase relation.

18. The process of claim 14, further comprised of:
detecting a direct current component, of said direct current value characteristic of said demodulated signal, during a sampling period.

19. The process of claim 18, further comprised of:
generating a third intermediate signal by attenuating alternating current components accompanying said direct current component; and
filtering said third intermediate signal to provide said parameter value.

20. The process of claim 19, further comprised of applying only a predetermined number of the most significant bits of said parameter value to control said generation of said first and second local oscillation frequency signals.

21. A process for controlling frequency during quadrature phase demodulation of frequency or phase modulated signals, comprising the steps of:
generating a plurality of local oscillation signals having the same frequency but differing in phase, for mixing with an input signal, representative of said frequency or phase modulated signals, to provide a plurality of phase differing intermediate signals;

converting a phase relation between said plurality of phase differing intermediate signals into digital signals by applying a formula MODULO ($\pi/2^n$) to phases of said phase differing intermediate signals;

generating a plurality of data signals on the basis of said digital signals, with said data signals representing information about changes of phase, said data signals including a first interrupt signal representing changes in phase of said formula;

generating a demodulated signal on the basis of said digital signals by interpolating said digital signals;

determining a direct current value characteristic of said demodulated signal during a period of a sampling signal, and generating a parameter value indicative of said direct current value characteristic, said parameter value comprising a plurality of bits; and controlling said step of generating said plurality of local oscillation signals in dependence upon said parameter value.

22. The process of claim 21, further comprised of additionally generating as said plurality of data signals, a first control signal representing polarity of phase rotation, a second control signal representing whether said phase rotation is increasing or decreasing, and a third control signal representing occurrence of variation in direction of polarity-advance of said phase rotation.

23. The process of claim 21, further comprised of eliminating harmonic frequency and image signals from said plurality of phase differing intermediate signals while converting said information defining phase relations into digital signals.

24. The process of claim 21, further comprised of setting said differences in phase to ($\pi/2$).

25. The process of claim 21, further comprised of detecting zero crossings of said plurality of phase differing intermediate signals before said step of converting said phase relation.

26. The process of claim 21, further comprised of:
detecting a direct current component of said direct current value characteristic of said demodulated signal during a sampling period.

27. The process of claim 26, further comprised of:
generating a third intermediate signal by attenuating alternating current components accompanying said direct current component; and
filtering said third intermediate signal to provide said parameter value.

28. The process of claim 27, further comprised of utilizing only a predetermined number of the most significant bits of said parameter value in said controlling step.

29. A frequency control circuit, comprising:
means for converting a phase relation between first and second intermediate frequency signals having the same frequency but differing in phase, into digital signals by comparing phases of said first and second intermediate frequency signals;

means for generating a plurality of data signals on the basis of said digital signals, with said data signals representing information about changes of phase between said first and second intermediate frequency signals, said data signals including a first interrupt signal representing changes in phase;

means for generating a demodulated signal on the basis of said data signals, by interpolating said data signals, and for determining a direct current value characteristic of said demodulated signal during a current period and generating a parameter value indicative of said direct current value; and means for generating said first and second intermediate frequency signals in dependence upon said parameter value.

30. The circuit of claim 29, further comprised of:
means for amplifying frequency or phase modulated radio frequency signals exhibiting a carrier frequency to provide amplified signals;

first means for mixing a first local frequency signal with said amplified signals to produce said first intermediate frequency signals; and second means for mixing a second local frequency signal with said amplified signals to produce said second intermediate frequency signals;

said first and second local frequency signals exhibiting the same frequency as said carrier frequency, with said first and second local frequency signals differing in phase.

31. The circuit of claim 29, further comprised of means disposed between said first and second mixing means and said converting means for eliminating harmonic frequency and image signals from said first and second intermediate signals while converting said phase relation into digital signals.

32. The circuit of claim 30, further comprised of said first and second mixing means setting said differences in phase to ($\pi/2$).

33. The circuit of claim 29, further comprised of said converting means detecting zero crossings of said first and second intermediate signals before converting said phase relation.

* * * * *